United States Patent [19]

Tsuchido

[11] Patent Number: 5,038,119
[45] Date of Patent: Aug. 6, 1991

[54] PIEZOELECTRIC OSCILLATOR SEMICONDUCTOR CIRCUIT WITH OSCILLATION CIRCUIT ADJUSTMENT MEANS

[75] Inventor: Kenji Tsuchido, Nagan, Japan
[73] Assignee: Seiko Epson Corporation, Japan
[21] Appl. No.: 487,756
[22] Filed: Mar. 1, 1990
[30] Foreign Application Priority Data
  Mar. 3, 1989 [JP] Japan .................. 1-51418
[51] Int. Cl.$^5$ .......................... H03B 5/36
[52] U.S. Cl. .................. 331/158; 331/108 C; 331/116 FE; 331/179; 331/DIG. 3
[58] Field of Search ........... 331/108 C, 108 D, 116 R, 331/116 FE, 117 R, 117 FE, 158, 177 R, 179, DIG. 3

[56] References Cited

U.S. PATENT DOCUMENTS

| 3,754,152 | 8/1973 | Koehler et al. | 331/158 X |
| 4,574,255 | 3/1986 | Fujii et al. | 331/158 X |
| 4,814,640 | 3/1989 | Miyake | 331/116 FE X |

FOREIGN PATENT DOCUMENTS

| 2638055 | 3/1977 | Fed. Rep. of Germany | 331/116 FE |
| 0137705 | 10/1980 | Japan | 331/116 FE |
| 86082 | 5/1982 | Japan . | |

Primary Examiner—David Mis
Attorney, Agent, or Firm—W. Douglas Carothers, Jr.

[57] ABSTRACT

A piezoelectric oscillator semiconductor circuit comprises a piezoelectric oscillator which is set to a designated oscillation frequency via electrical coupling to a separate semiconductor element comprising an oscillation circuit. The oscillation circuit in the semiconductor element has a gate lead and a drain lead connected to the piezoelectric oscillator to set the frequency of operation of the piezoelectric oscillator. Included in the semiconductor element are adjustment means comprising one or more frequency adjustment elements which may be selectively connected to one of the connection leads whereby the frequency of operation of the piezoelectric oscillator may be selectively changed without need for replacement or change of the semiconductor element. The frequency adjustment elements may be comprised of one or more fixed, separately formed capacitances provided as part of the semiconductor element but are electrically independent of the oscillation circuit, i.e., they share the same semiconductor substrate but are padded out of the semiconductor element independent of the pad outputs for the oscillation circuit.

6 Claims, 2 Drawing Sheets

PIEZOELECTRIC OSCILLATOR SEMICONDUCTOR CIRCUIT WITH OSCILLATION CIRCUIT ADJUSTMENT MEANS

BACKGROUND OF THE INVENTION

This invention relates generally to a piezoelectric oscillator semiconductor circuit and more particularly to a means for selectively adjusting the period of oscillation relative to oscillation circuits coupled to a piezoelectric oscillator.

It is known in the art to employ at least one oscillation circuit, shown in FIG. 3, in conjunction with a piezoelectric oscillator to set the oscillation frequency of the piezoelectric oscillator in the oscillator section of the combination circuit. Such an oscillation circuit comprises inverter 31, feed back resistance 32, drain resistance 33, a gate capacitance 34 connected to the gate of inverter 31 and a drain capacitance 35 connected to the drain of inverter 31. This intergrated circuit is provided with output electrode pads 38 and 39. FIG. 4 discloses the circuit of FIG. 3 in the form of semiconductor element 50 fixed on die pad 51. Element 50 is electrically connected to specified lead terminals 53, 54 and 55 via thin metal wires 52, e.g., Au wires. Piezoelectric section 56 comprising, for example, a quartz crystal oscillator is electrically connected to lead terminals 53 and 51. Then, semiconductor element 50, Au wire 52, crystal oscillator 56, die pad 51, and a part of lead terminals 53 to 55 are formed in a resin 57, such as epoxy resin or the like, by means of a transfer mold or the like as shown in FIG. 4.

In this combination of connected circuits, when the oscillation frequency of piezoelectric oscillator section 56 changes, it is also necessary to change the capacitance of the oscillation circuit in semiconductor element 50 in order to optimize stability for frequency operation at the new or changed oscillation frequency. However, the gate capacitance and the drain capacitance of the oscillation circuit, such as shown in FIG. 3, contained within semiconductor element 50 are, of course, fixed at the time of circuit fabrication. Therefore, the combination of connected circuits will oscillate under undesirable conditions so that abnormal oscillation, such as unstable oscillation, oscillation stop and the like, will occur when phase conditions, oscillation amplitude conditions or the like become unadjusted.

It is an object of the present invention to provide stable oscillation by optimizing for changes in oscillation frequency conditions even in the case when the oscillation frequency of piezoelectric oscillator is changed.

SUMMARY OF THE INVENTION

According to this invention, a piezoelectric oscillator semiconductor circuit comprises a piezoelectric oscillator which is set to a designated oscillation frequency via electrical coupling to a separate semiconductor element comprising an oscillation circuit. The oscillation circuit in the semiconductor element has a gate lead and a drain lead connected to the piezoelectric oscillator to set the frequency of operation of the piezoelectric oscillator. Included in the semiconductor element are adjustment means comprising one or more frequency adjustment elements which may be selectively connected to one of the connection leads whereby the frequency of operation of the piezoelectric oscillator may be selectively changed without need for replacement or change of the semiconductor element. The frequency adjustment elements may be comprise of one or more fixed, separately formed capacitances provided as part of the semiconductor element but are electrically independent of the oscillation circuit, i.e., they share the same semiconductor substrate but are padded out of the semiconductor element independent of the pad outputs for the gate and drain connections of the oscillation circuit.

Since the additional capacitances can be selectively connected to the respective two lead terminals connecting together the oscillation circuit and the piezoelectric oscillator, the capacitance value of the oscillation circuit in the semiconductor element can be set at an optimum value for the oscillation circuit at selectively designated oscillation frequencies when the oscillation frequency of the piezoelectric oscillator is changed thereby providing for stable oscillation.

Thus, the purpose of the additional frequency adjustment elements, e.g., capacitances, is to eliminate the need for replacement or change of the semiconductor element or to eliminate the requirement of several such semiconductor elements to provide for different oscillation frequencies. With one or more additional capacitances on the same semiconductor element chip, none, one or more of such capacitances may be selectively connected to one or the other of the two connection points between the oscillator circuit and the piezoelectric oscillation circuit. In this manner, the semiconductor element containing the oscillation circuit and the additional capacitances can be made as a standard part and employed in several different applications requiring different oscillation frequencies or requiring changes in oscillation frequencies of the piezoelectric oscillator.

Other objects and attainments together with a fuller understanding of the invention will become apparent and appreciated by referring to the following description and claims taken in conjunction with the accompanying drawings.

DESCRIPTION OF THE PREFERRED EMBODIMENTS

Figure 1:
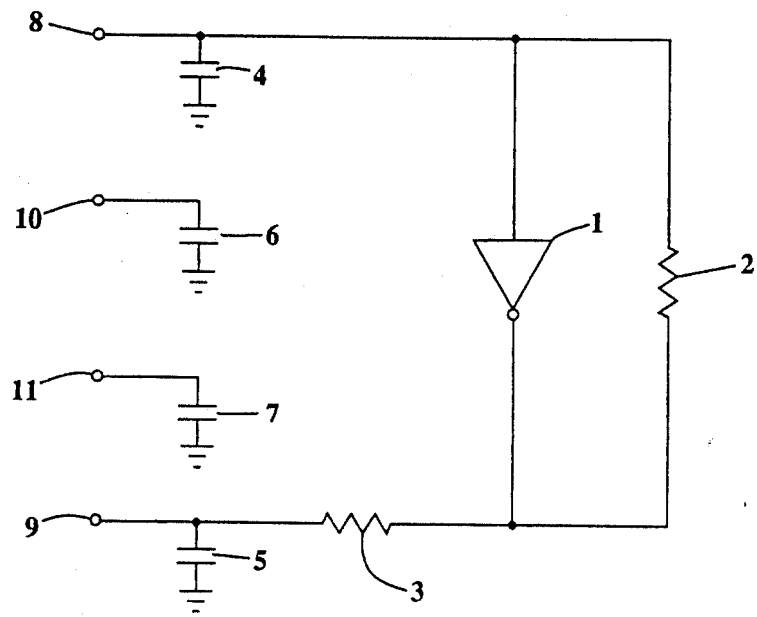
FIG. 1 is a circuit diagram of an oscillation circuit and associated capacitances as structured within a semiconductor element shown in FIG. 2A.

Reference is now made to FIG. 1 is an illustration of an oscillation circuit and separate capacitance structured in semiconductor element 20 comprising this invention. In semiconductor element 20, the oscillation circuit comprises a feed back resistance 2 connected in parallel with inverter 1. Gate capacitance 4 is connected to the gate of inverter 1 and to electrode gate pad 8. Also, drain capacitance 5 is connected to the drain of inverter 1 via drain resistance 3 and to electrode drain pad 9, completing the oscillation circuit. However, in addition, capacitances 6 and 7 are also integrated into the same semiconductor element 20 as separate or independent frequency adjustment elements and are respectively connect to electrode pads 10 and 11. Pads 10 and 11 of respective capacitances 6 and 7 are placed between electrode pads 8 and 9 of the oscillation circuit structured in semiconductor element 20, as illustrated in FIGS. 2A and 2B.

Figure 2A:
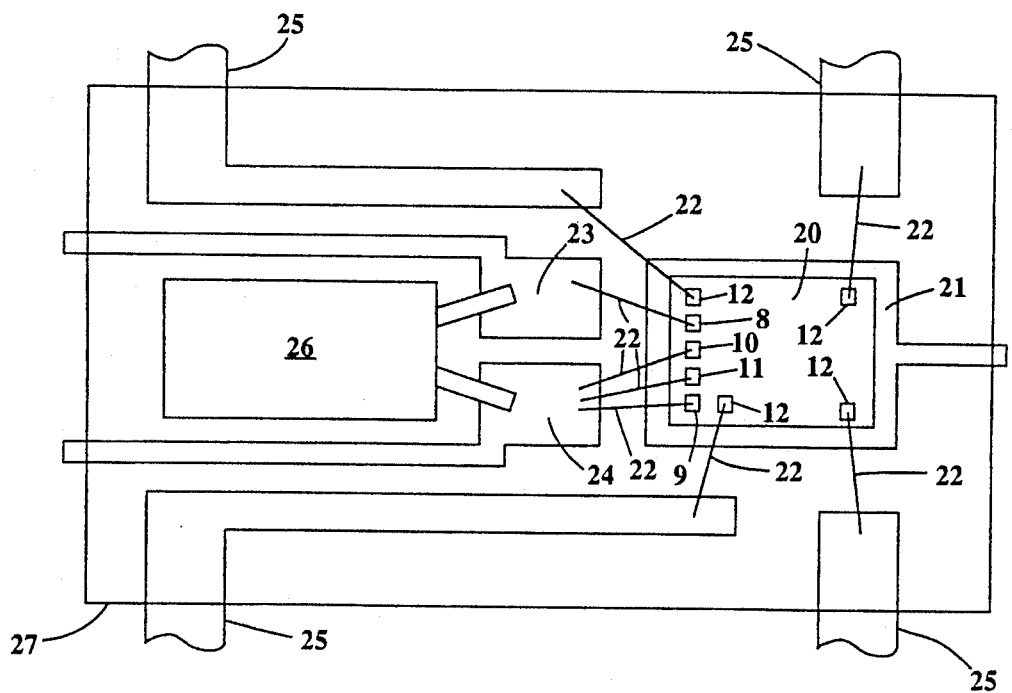
FIG. 2A is a plan view of a resin molded combination semiconductor oscillation circuit and a piezoelectric oscillator relative to one embodiment of this invention.
Figure 2B:
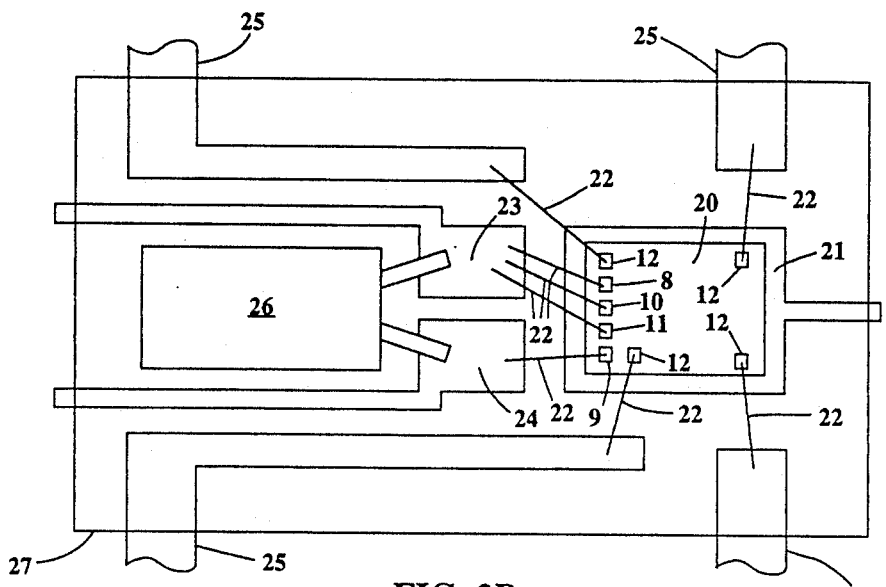
FIG. 2B is a plan view of a resin molded combination semiconductor oscillation circuit and a piezoelectric oscillator relative to another embodiment of this invention.
Figure 3:
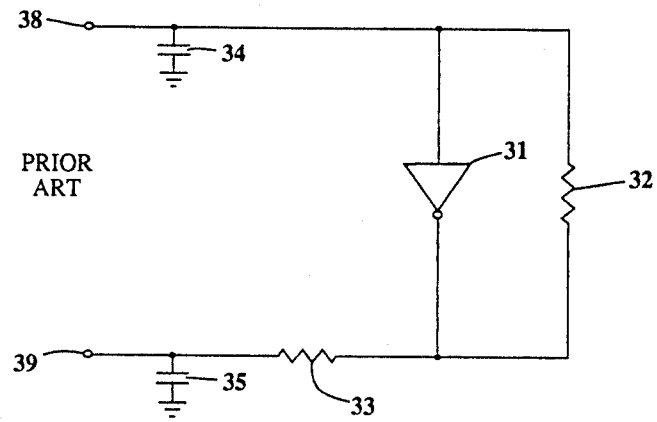
FIG. 3 is a circuit diagram of a prior art oscillation circuit structured within a semiconductor element shown in FIG. 4.
Figure 4:
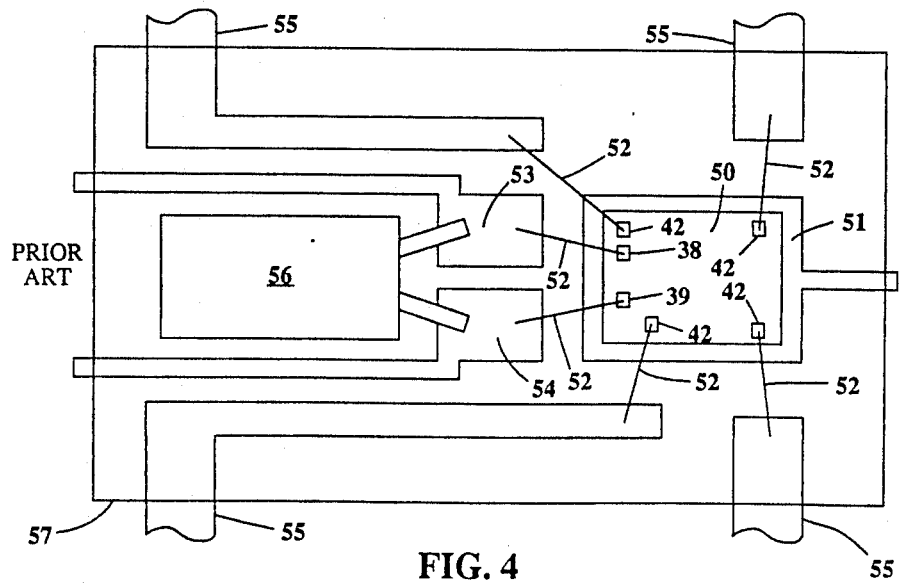
FIG. 4 is a plan view of a resin molded combination semiconductor oscillation circuit and a piezoelectric oscillator of the prior art.

FIGS. 2A and 2B are plan views of the combination of semiconductor element 20 and a piezoelectric oscillator 26 positioned together in the molded form 27 in association with various metal leads 23 through 25.

Semiconductor element 20 is fixed on die pad 21 and is electrically connected, via wire bonding or the like employing a thin metal wire, e.g., Au wire, to lead terminals 23 through 25 as indicated in FIGS. 2A and 2B. Leads from one or both pads 10 and 11 of additional capacitances 6 and 7 may be electrically connected either to terminal 23, as shown in FIG. 2A, or to terminal 24, as shown in FIG. 2B. Quartz crystal oscillator section 26 is electrically connected to both lead terminal 23, which also connected to gate pad 8 of semiconductor element 20, and to lead terminal 24, which is also connected to drain pad 9 of semiconductor element 20. Then, semiconductor element 20, Au wire 22, crystal oscillator 26, die pad 21, and a part of lead terminals 23 to 25 are formed in a resin 27, such as expoxy resin or the like, by means of a transfer mold or the like. The selection for connection of either or both capacitance 6 and 7 to either terminal 23 or 24 is based upon the selected range of frequency of operation desired for crystal oscillator 26 as exemplified in Table 1 below. Thus, many oscillation circuit conditions can be created by selecting combinations of different capacitor cells 6 and 7 formed in the same semiconductor element 20 with output electrode pads 10 and 11 of these respective cells formed between the gate and drain electrode pads 8 and 9 of the oscillation circuit. Thus, pads 10 and 11 can be easily connected to either terminal 23 or 24 to achieve the desired phase conditions of the oscillation circuit.

In Table 1, $C_G$, $C_D$, $C_1$, and $C_2$ respectively represent gate capacitance 4, drain capacitance 5, capacitance 6, and capacitance 7. Since capacitances 6 and 7 can be selectively connected with either lead terminal 23 for the gate side of the oscillation circuit or with lead terminal 24 for the drain side of the oscillation circuit, or one connected to lead terminal 23 for the gate side of oscillation circuit and the other connected to lead terminal 24 for the drain side of the oscillation ciruit, via wire bonding or the like, the gate and drain capacitances of the oscillation circuit structed within semiconductor element 20 are effectively changed as desired to provide the desired frequency of operation.

As noted from Table 1, in the first example, capacitances 6 and 7 are respectively connected to terminals 23 and 24. In the second sample, capacitances 6 and 7 are both connected to terminal 24, which is the case for FIG. 2A. In the third example, only capacitor 6 is connected and it is connected to terminal 24. In the fourth example, only capacitor 7 is connected and it is connected to terminal 24. In the fifth example, neither capacitance 6 or 7 are connected to terminals 23 and 24. Thus, all these variations in capacitance value in the selective connection of capacitors 6 and 7 provide for a wide range of stabilized oscillation frequency.

| Oscillation Frequency (MHz) | Connection to Terminal 23 (Gate Side) (pF) | Connection to Terminal 24 (Drain Side) (pF) |
| --- | --- | --- |
| Less than 30 and up to 38 | 23 ($C_G + C_1$) | 15 ($C_D + C_2$) |
| Less than 38 and up to 43 | 3 ($C_G$) | 35 ($C_D + C_1 + C_2$) |
| Less than 43 and up to 46 | 3 ($C_G$) | 25 ($C_D + C_1$) |
| Less than 46 and up to 55 | 3 ($C_G$) | 15 ($C_D + C_2$) |
| Less than 55 and up to 64 | 3 ($C_G$) | 5 ($C_D$) |

While Table 1 illustrates five different states or conditions for selecting phase conditions of the oscillation circuit, there are three additional possible selections comprising $C_D$ on the drain side in combination with $C_G + C_1$ or $C_G + C_2$ or $C_G + C_1 + C_2$ on the drain side, which selections have not been indcluded in the Table. Thus, a total of eight different combinations are possible and the number of different oscillation conditions can be further extended with the addition of more capacitor cells between electrode pads 8 and 9.

While the invention has been described in conjunction with several specific embodiments, it is evident to those skilled in the art that many further alternatives, modifications and variations will be apparent in light of the forgoing description. For example, capacitances 6 and 7 need not be formed in semiconductor element 20 but may be formed in a separate semiconductor element. Further, additional capacitances, i.e., several capacitors, may be provided in semiconductor element 20 as required to extend the possible range of oscillation frequency adjustment. Also, the circuit components may also be placed on a circuit board in lieu of being molded in epoxy 27. Thus, the invention described herein is intended to embrace at such alternatives, modifications, applications and variations as fall within the spirit and scope of the appended claims.

What is claimed is:

1. A semiconductor element comprising an oscillation circuit having a pair of output electrode pads electrically connected to corresponding terminals of a piezoelectric oscillator, said semiconductor element also including one or more capacitance cells with corresponding output capacitor cell pads positioned between said output electrode pads, one or more of said capacitance cell pads selectively connected to one of said oscillator terminals whereby the frequency of operation of said piezoelectric oscillator may be selectively changed.

2. A piezoelectric oscillator unit comprising
   a piezoelectric oscillator having output terminals,
   a semiconductor element including an oscillation circuit having a pair of output electrode pads electrically connected to corresponding of said output terminals of said piezoelectric oscillator, and one or more frequency adjustment elements with corresponding output frequency adjustment elements pads positioned between said output electrode pads, wherein none, one or more of said frequency adjustment element pads may be selectively connected to one or the other of said oscillator output terminals whereby the frequency of operation of said piezoelectric oscillator may be selectively changed.

3. The piezoelectric oscillator unit of claim 2 wherein said frequency adjustment elements comprise at least two fixed, separate capacitances formed in said semiconductor element, said capacitances formed independent of said oscillation circuit whereby one or more of said capacitances may be selectively connected to one or the other of said oscillator output terminals to selectively change the total capacitance of said oscillation circuit.

4. The piezoelectric oscillator unit of claim 2 wherein said piezoelectric oscillator and said semiconductor element are molded in epoxy.

5. A method of selectively varying the set frequency of operation of a piezoelectric oscillator electrically connected to a separate oscillation circuit formed in a semiconductor element wherein said semiconductor element provides output electrode pads for said oscillation circuit which are connected through coupling means to said piezoelectric oscillator to set a fixed frequency operation for said piezoelectric oscillator and comprising the steps of:

forming one or more frequency adjustment elements in said semiconductor element with corresponding output frequency adjustment element pads positioned between said semiconductor element output electrode pads, and selectively connecting none, one or more of said frequency adjustment element pads to one or the other of a pair of terminals of said piezoelectric oscillator to readjust the operation of said oscillation circuit to cause said piezoelectric oscillator to oscillate at a different frequency whereby the frequency of said piezoelectric oscillator can be changed without the necessity of requiring replacement of said semiconductor element.

6. The method of claim 5 wherein said frequency adjustment elements comprise at least two fixed, separate capacitances formed in said semiconductor element but formed independent of said oscillation circuit, said coupling means comprising a pair of connections between said piezoelectric circuit and said oscillation circuit and comprising the step of selectively connecting none, one or more of said capacitances to one or the other of said connections to change the oscillation frequency of said piezoelectric oscillator.

* * * * *